(12) United States Patent
Akiyama

(10) Patent No.: US 6,874,898 B2
(45) Date of Patent: Apr. 5, 2005

(54) THIN FILM APPARATUS, A MANUFACTURING METHOD OF THE THIN FILM APPARATUS, AN ACTIVE MATRIX SUBSTRATE, A MANUFACTURING METHOD OF THE ACTIVE MATRIX SUBSTRATE, AND AN ELECTRO-OPTICAL APPARATUS HAVING THE ACTIVE MATRIX SUBSTRATE

(75) Inventor: Yoshikazu Akiyama, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/418,109

(22) Filed: Apr. 18, 2003

(65) Prior Publication Data

US 2003/0223138 A1 Dec. 4, 2003

(30) Foreign Application Priority Data

Apr. 24, 2002 (JP) ........................................ 2002-122329

(51) Int. Cl.[7] .......................... G02B 5/08; G02B 7/182
(52) U.S. Cl. ..................... 359/883; 349/45; 438/778; 257/382; 257/411; 257/412; 257/413
(58) Field of Search .......................... 349/45; 257/310, 257/382, 411, 412, 413; 359/883; 438/778

(56) References Cited

U.S. PATENT DOCUMENTS

| | | | |
|---|---|---|---|
| 4,883,766 A | 11/1989 | Ishida et al. | |
| 5,555,219 A | 9/1996 | Akiyama et al. | |
| 5,610,853 A | 3/1997 | Akiyama et al. | |
| 5,729,262 A | 3/1998 | Akiyama et al. | |
| 6,144,082 A * | 11/2000 | Yamazaki et al. | ........... 257/412 |
| 6,608,357 B1 * | 8/2003 | Yamazaki et al. | ........... 257/412 |
| 6,700,631 B1 * | 3/2004 | Inoue et al. | ................... 349/45 |

* cited by examiner

Primary Examiner—Michael Tran
Assistant Examiner—Renee R. Berry
(74) Attorney, Agent, or Firm—Oblon, Spivak, McClelland, Maier & Neustadt, P.C.

(57) ABSTRACT

A manufacturing method of a thin film apparatus, includes: a first step for forming a separation layer on a heat resistant substrate; a second step for forming a thin film device on the separation layer; a third step for providing a surface layer on the thin film device; and a fourth step for generating a peeling phenomenon at the interface of the separation layer and the heat resistant substrate so as to peel the heat resistant substrate from a side of the thin film device.

29 Claims, 4 Drawing Sheets

THIN FILM APPARATUS, A MANUFACTURING METHOD OF THE THIN FILM APPARATUS, AN ACTIVE MATRIX SUBSTRATE, A MANUFACTURING METHOD OF THE ACTIVE MATRIX SUBSTRATE, AND AN ELECTRO-OPTICAL APPARATUS HAVING THE ACTIVE MATRIX SUBSTRATE

BACKGROUND OF THE INVENTION

1. Field of the Invention

The present invention generally relates to a thin film apparatus, a manufacturing method of the thin film apparatus, an active matrix substrate, a manufacturing method of the active matrix substrate, and an electro-optical apparatus having the active matrix substrate, and more particularly technologies whereby the thin film device is formed on the substrate and then peeled from the substrate.

2. Description of the Related Art

A semiconductor process is utilized for manufacturing a thin film transistor (hereinafter "TFT"), as a switching element, on a substrate for an active matrix type liquid crystal display apparatus using a liquid crystal as electro-optical material. Since the above mentioned process includes a step having a high temperature process, it is necessary to use a substrate made of material having good heat resistance, namely material having both a high softening point and a high melting point. Therefore, presently, quartz glass is used as a substrate that can resist a temperature of approximately 1000 degrees centigrade and a heat resistant glass is used as a substrate that can resist temperature of approximately 500 degrees centigrade.

Thus, a substrate where the thin film device such as the TFT is provided can resist a temperature condition or the like for manufacturing the thin film device. However, the above mentioned quartz glass or heat resistant glass is not always advantageous after the substrate where thin film device such as the TFT is provided is completed. For example, in a case where thee quartz glass or the heat resistant glass is used for resisting the manufacturing process having the heat temperature process, the product price of the display apparatus or the like is high, as these substrates are extremely expensive.

In addition, it is required for the display apparatus used for a portable electronic machine, such as a palm top computer or a portable phone, to have a price as low as possible, a light weight, some resistance to deformation, and a resistance to splitting even if the display apparatus is dropped. However, the quartz glass or the heat resistant glass is heavy, poor at resisting deformations and easy to become split if the display apparatus is dropped. Accordingly, the substrate used for the conventional thin film apparatus has problems in that the substrate is not suited for limitations in terms of manufacturing conditions and characteristics required for the product.

Meanwhile, Japanese Laid-Open Patent Application No. 10-125929 discloses a technology whereby after a polycrystalline silicon TFT is formed on a first substrate under conditions equivalent to conventional processes, the thin film device is peeled from the first substrate and transferred to a second substrate. A separation layer is formed between the first substrate and the thin film device and energy light, for example, is projected onto the separation layer. As a result of this, the thin film device is peeled from the first substrate and transferred to a side of the second substrate.

Recently, an organic TFT and an organic electroluminescent (hereinafter "EL") element have been studied as organic thin film electronic devices, and a manufacturing an organic EL display driven by an organic TFT active matrix driving has been attempted as an application of the organic TFT and the organic EL element. The organic electronic device does not need expensive manufacturing equipment to be manufactured, unlike the polycrystalline silicon TFT. The organic electronic device can be manufactured cheaply and is suitable as a display apparatus used for the above mentioned palm top computer and the portable electronic machine such as the portable phone.

In a case where the above mentioned organic TFT is formed on a plastic sheet (substrate), it is very difficult to directly form the active element thereon, because the substrate is poor at measurement stability.

Japanese Laid-Open Patent Application No. 8-62591 discloses a technology whereby an active matrix layer, pre-formed on a substrate having good heat resistance such as glass, is transferred onto the plastic sheet substrate. In the technology disclosed in the Japanese Laid-Open Patent Application No. 8-62591, complex steps, such as application of metal plating to a release layer and providing a transparent electric insulation layer to the active matrix layer, are required. In addition, the technology disclosed in the Japanese Laid-Open Patent Application No. 8-62591 has a problem of stress being generated due to use of a solvent type pressure-sensitive adhesive composition as an adhesive composition. Furthermore, Japanese Laid-Open Patent Application No. 2001-356370 discloses complex steps whereby a slit is additionally formed and an inorganic buffer layer is arranged in order to protect the active matrix layer from an external force at the time of transferring.

According to the above mentioned technologies, a release separation layer is formed and transferred to second and third substrates, so that an active matrix substrate is formed on a flexible sheet having a large area.

An important technology with regard to a transferring method is a peeling step. The above mentioned technologies can be divided into: methods for a reduction of an adhering force based on a phase change phenomena by laser irradiation applied to amorphous silicon, and a reduction of an adhering force based on radiation irradiation (Japanese Laid-Open Patent Application No. 8-152512); a method for physical and chemical removal of a substrate (Japanese Laid-Open Patent Applications No. 10-189924 and No. 11-31828); and a method for protecting an element from a stress-generating mechanical peeling.

However, there is a problem in that the peeling phenomenon at the separation layer is not properly generated in the conventional peeling method and transferring method. Furthermore, there is a conventional limitation of the size of the substrate, so that it is impossible to apply an element having a large area, which is a specific future requirement of organic electronic devices.

SUMMARY OF THE INVENTION

Accordingly, it is a general object of the present invention to provide a novel and useful thin film apparatus, manufacturing method of the thin film apparatus, active matrix substrate, manufacturing method of the active matrix substrate, and electro-optical device having the active matrix substrate.

Another and more specific object of the present invention is to provide (1) a manufacturing method of a thin film apparatus whereby an organic film used as a separation layer is made properly so that a thin film device can be peeled from a substrate without any damage, and the thin film device can be transferred to another substrate, (2) a manufacturing method of a thin film apparatus whereby a separation layer is made to have sufficient mechanical strength, so that in manufacturing it can be handled as an independent body without using a transferring substrate as the conventional second substrate, and connected to another substrate that is a support substrate at the same side as the first substrate, (3) a manufacturing method of a thin film apparatus whereby a separation layer is made to have a higher mechanical strength and used as an independent body, (4) a thin film apparatus manufactured by the above mentioned methods, (5) a manufacturing method of an active matrix substrate using the above mentioned manufacturing methods of the thin film apparatus, (6) an active matrix substrate manufactured by the above mentioned method, and (7) an electro-optical device having the active matrix substrate.

The above objects can be achieved by a manufacturing method of a thin film apparatus, including:

a first step for forming a separation layer on a heat resistant substrate;

a second step for forming a thin film device on the separation layer;

a third step for providing a surface layer at a side of the thin film device opposite to another side that faces the heat resistant substrate; and a fourth step for generating a peeling phenomenon at an interface of the separation layer and the heat resistant substrate so as to peel the heat resistant substrate from the other side of the thin film device, wherein an organic layer is formed as the separation layer in the first step, the organic layer having a characteristic that generates a peeling phenomenon because of a reduction of an adhering force to the heat resistant substrate of the separation layer based on a liquid phase existing at the interface of the separation layer and the heat resistant substrate, and the peeling phenomenon is generated in the fourth step by generating the liquid phase at the interface of the separation layer and the heat resistant substrate.

According to the above mentioned invention, the separation layer is an organic film. Therefore, the strong adhering force to the heat resistant substrate of the separation layer is changed to an extremely weak adhering force based on a liquid phase that exists at the interface of the separation layer and the heat resistant substrate. Hence, the peeling phenomenon is generated at the interface. Accordingly, the heat resistant substrate can be peeled from a side of the thin film device and the thin film device can be transferred to a side of a surface substrate. Hence, conditions required for materials of the substrate of final products become relax so that the thin film apparatus having high reliability can be manufactured at low prices.

In the above mentioned method, the separation layer may be made of poly-para-xylylene or a derivative of the poly-para-xylylene.

According to the above mentioned invention, since poly-para-xylylene or a derivative of the poly-para-xylylene is used as the separation layer, the peeling phenomenon based on the liquid phase existing at the interface of the separation layer and the heat resistant substrate is generated remarkably. Hence, it is possible to peel the heat resistant substrate from the side of the thin film device easily. That is, the separation layer has a substrate adhering force resisting sufficiently the organic TFT process. In addition, in the peeling step, the peeling phenomenon can be implemented easily based on a reduction of the adhering force.

In the above mentioned method, the separation layer may have a film thickness greater than 10 $\mu$m.

According to the above mentioned invention, since the film thickness of the separation layer is large, it is possible to peel the heat resistant substrate from the side of the thin film device and obtain an independent body wherein the separation layer is a substrate.

In the above mentioned method, an organic layer functioning as a surface protection layer may be formed as the surface layer in the third step.

According to the above mentioned invention, it is possible to improve resistance to weather of the thin film apparatus.

In the above mentioned method, the organic layer may be made of the same material as the separation layer.

According to the above mentioned invention, it is possible to avoid preparing another manufacturing apparatus for the protection film.

The above mentioned method further includes a fifth step for adhering a bottom surface substrate on a surface where the heat resistant substrate is peeled from the thin film device in the fourth step.

According to the above mentioned invention, in the thin film apparatus having a bottom surface substrate with flexibility, a stuck structure at the time when the thin film device is formed on the heat resistant substrate can be maintained without making a pattern, formed at first, turned over.

In the above mentioned method, in the third step the surface layer may be provided by adhering a surface substrate different from the heat resistant substrate with an adhesive layer, and in the fourth step the thin film device may be transferred to the surface substrate at the same time when the heat resistant substrate is peeled from the other side of the thin film device.

According to the above mentioned invention, since transferring is implemented by adhering the substrate having flexibility to a surface at the side opposite to the heat resistant substrate, it is possible to obtain the thin film apparatus having high reliability.

In the above mentioned method, the adhesive layer also may serve as the separation layer, and further includes a fifth step for adhering a bottom surface substrate on a surface where the heat resistant substrate is peeled from the thin film device in the fourth step, and a sixth step for transferring the thin film device to a side of the bottom surface substrate, by generating a peeling phenomenon at least either in the adhesive layer also serving as the separation layer or at the interface of the adhesive layer, so as to peel the surface substrate from the other side of the thin film device.

According to the above mentioned invention, in the thin film apparatus having a bottom surface substrate with flexibility, a stuck structure at the time when the thin film device is formed on the heat resistant substrate can be maintained without making a pattern, formed at first, turned over.

In the above mentioned method, at least an organic thin film transistor may be formed on the heat resistant substrate as the thin film device in the second step.

According to the above mentioned invention, it is possible to obtain a thin film apparatus that can be applied widely because at least a TFT is formed on the heat resistant substrate.

The above objects can be achieved by a thin film apparatus manufactured by a manufacturing method, the manufacturing method including a first step for forming a separation layer on a heat resistant substrate;

a second step for forming a thin film device on the separation layer;

a third step for providing a surface layer at a side of the thin film device opposite to another side that faces the heat resistant substrate; and a fourth step for generating a peeling phenomenon at an interface of the separation layer and the heat resistant substrate so as to peel the heat resistant substrate from the other side of the thin film device, wherein an organic layer is formed as the separation layer in the first step, the organic layer having a characteristic that generates a peeling phenomenon because of a reduction of an adhering force to the heat resistant substrate of the separation layer based on a liquid phase existing at the interface of the separation layer and the heat resistant substrate, and the peeling phenomenon is generated in the fourth step by generating the liquid phase at the interface of the separation layer and the heat resistant substrate.

According to the above mentioned invention, it is possible to manufacture the thin film apparatus having high reliability.

The above objects can be achieved by a manufacturing method of an active matrix substrate having a thin film transistor as forming a matrix, including:

a first step for forming a separation layer on a heat resistant substrate;

a second step for forming a thin film transistor for pixel switching on the separation layer as forming a matrix;

a third step for providing a surface layer at a side of the thin film transistor opposite to another side that faces the heat resistant substrate; and a fourth step for generating a peeling phenomenon at an interface of the separation layer and the heat resistant substrate so as to peel the heat resistant substrate from the other side of the thin film transistor, wherein an organic layer is formed as the separation layer in the first step, the organic layer having a characteristic that generats a peeling phenomenon because of a reduction of an adhering force to the heat resistant substrate of the separation layer based on a liquid phase existing at the interface of the separation layer and the heat resistant substrate, and the peeling phenomenon is generated in the fourth step by generating the liquid phase at the interface of the separation layer and the heat resistant substrate.

In the second step, the thin film transistor may be formed on the heat resistant substrate as forming a matrix, and a scanning line electrically connecting to a gate of the thin film transistor, a data line electrically connecting to a source of the thin film transistor, and a pixel electrode electrically connecting to a drain of the thin film transistor are formed.

The above objects can be achieved by a manufacturing method of an active matrix substrate having a driving circuit providing a thin film transistor, including:

a first step for forming a separation layer on a heat resistant substrate;

a second step for forming the thin film transistor for the driving circuit on the separation layer;

a third step for providing a surface layer at a side of the thin film transistor opposite to another side that faces the heat resistant substrate; and a fourth step for generating a peeling phenomenon at an interface of the separation layer and the heat resistant substrate so as to peel the heat resistant substrate from the other side of the thin film transistor, wherein an organic layer is formed as the separation layer in the first step, the organic layer having a characteristic generating a peeling phenomenon because of a reduction of an adhering force to the heat resistant substrate of the separation layer based on a liquid phase existing at the interface of the separation layer and the heat resistant substrate, and the peeling phenomenon is generated in the fourth step by generating the liquid phase at the interface of the separation layer and the heat resistant substrate.

The above objects can be achieved by an active matrix substrate having a thin film transistor as forming a matrix manufactured by a manufacturing method, the manufacturing method including:

a first step for forming a separation layer on a heat resistant substrate;

a second step for forming the thin film transistor for pixel switching on the separation layer as forming a matrix;

a third step for providing a surface layer at a side of the thin film transistor opposite to another side that faces the heat resistant substrate; and a fourth step for generating a peeling phenomenon at an interface of the separation layer and the heat resistant substrate so as to peel the heat resistant substrate from the other side of the thin film transistor, wherein an organic layer is formed as the separation layer in the first step, the organic layer having a characteristic generating a peeling phenomenon because of a reduction of an adhering force to the heat resistant substrate of the separation layer based on a liquid phase existing at the interface of the separation layer and the heat resistant substrate, and the peeling phenomenon is generated in the fourth step by generating the liquid phase at the interface of the separation layer and the heat resistant substrate.

The above objects can be achieved by an active matrix substrate having a driving circuit providing a thin film transistor, manufactured by a manufacturing method, the manufacturing method including:

a first step for forming a separation layer on a heat resistant substrate;

a second step for forming the thin film transistor for the driving circuit on the separation layer;

a third step for providing a surface layer at a side of the thin film transistor opposite to another side that faces the heat resistant substrate; and a fourth step for generating a peeling phenomenon at an interface of the separation layer and the heat resistant substrate so as to peel the heat resistant substrate from the other side of the thin film transistor, wherein an organic layer is formed as the separation layer in the first step, the organic layer having a characteristic generating a peeling phenomenon because of a reduction of an adhering force to the heat resistant substrate of the separation layer based on a liquid phase existing at the interface of the separation layer and the heat resistant substrate, and the peeling phenomenon is generated in the fourth step by generating the liquid phase at the interface of the separation layer and the heat resistant substrate.

According to the above mentioned inventions, it is possible to manufacture the active matrix substrate having a light weight and a large area.

The above objects can be achieved by an electro-optical apparatus having an active matrix substrate, the active matrix substrate having a thin film transistor as forming a matrix manufactured by a manufacturing method, the manufacturing method including:

a first step for forming a separation layer on a heat resistant substrate;

a second step for forming the thin film transistor for pixel switching on the separation layer as forming the matrix;

a third step for providing a surface layer at a side of the thin film transistor opposite to another side that faces the heat resistant substrate; and a fourth step for generating a peeling phenomenon at an interface of the separation layer and the heat resistant substrate so as to peel the heat resistant substrate from the other side of the thin film transistor, wherein an organic layer is formed as the separation layer in the first step, the organic layer having a characteristic generating a peeling phenomenon because of a reduction of an adhering force to the heat resistant substrate of the separation layer based on a liquid phase existing at the interface of the separation layer and the heat resistant substrate, and the peeling phenomenon is generated in the fourth step by generating the liquid phase at the interface of the separation layer and the heat resistant substrate.

The above objects can be achieved by an electro-optical apparatus having an active matrix substrate, the active matrix substrate having a driving circuit providing a thin film transistor, manufactured by a manufacturing method, the manufacturing method including:

a first step for forming a separation layer on a heat resistant substrate;

a second step for forming the thin film transistor for the driving circuit on the separation layer;

a third step for providing a surface layer at a side of the thin film transistor opposite to another side that faces the heat resistant substrate; and a fourth step for generating a peeling phenomenon at an interface of the separation layer and the heat resistant substrate so as to peel the heat resistant substrate from a side of the thin film transistor, wherein an organic layer is formed as the separation layer in the first step, the organic layer having a characteristic generating a peeling phenomenon because of a reduction of an adhering force to the heat resistant substrate of the separation layer based on a liquid phase existing at the interface of the separation layer and the heat resistant substrate, and the peeling phenomenon is generated in the fourth step by generating the liquid phase at the interface of the separation layer and the heat resistant substrate.

The above objects can be achieved by an electro-optical apparatus having an active matrix substrate and a liquid crystal element or an electrophoresis display element, the active matrix substrate having a thin film transistor as forming a matrix manufactured by a manufacturing method, the manufacturing method including:

a first step for forming a separation layer on a heat resistant substrate;

a second step for forming the thin film transistor for pixel switching on the separation layer as forming the matrix;

a third step for providing a surface layer at a side of the thin film transistor opposite to another side that faces the heat resistant substrate; and a fourth step for generating a peeling phenomenon at an interface of the separation layer and the heat resistant substrate so as to peel the heat resistant substrate from the other side of the thin film transistor, wherein an organic layer is formed as the separation layer in the first step, the organic layer having a characteristic generating a peeling phenomenon because of a reduction of an adhering force to the heat resistant substrate of the separation layer based on a liquid phase existing at the interface of the separation layer and the heat resistant substrate, and the peeling phenomenon is generated in the fourth step by generating the liquid phase at the interface of the separation layer and the heat resistant substrate.

The above objects can be achieved by an electro-optical apparatus having an active matrix substrate and a liquid crystal element or an electrophoresis display element, the active matrix substrate having a driving circuit providing a thin film transistor, manufactured by a manufacturing method, the manufacturing method including:

a first step for forming a separation layer on a heat resistant substrate;

a second step for forming the thin film transistor for the driving circuit on the separation layer;

a third step for providing a surface layer at a side of the thin film transistor opposite to another that faces the heat resistant substrate; and a fourth step for generating a peeling phenomenon at an interface of the separation layer and the heat resistant substrate so as to peel the heat resistant substrate from the other side of the thin film transistor, wherein an organic layer is formed as the separation layer in the first step, the organic layer having a characteristic generating a peeling phenomenon because of a reduction of an adhering force to the heat resistant substrate of the separation layer based on a liquid phase existing at the interface of the separation layer and the heat resistant substrate, and the peeling phenomenon is generated in the fourth step by generating the liquid phase at the interface of the separation layer and the heat resistant substrate.

According to the above mentioned inventions, it is possible to obtain an electro-optical apparatus having a light weight and a large area.

Other objects and further features of the present invention will become apparent from the following detailed description when read in conjunction with the accompanying drawings.

DETAILED DESCRIPTION OF THE PREFERRED EMBODIMENTS

[First and Second Embodiment]

FIG. 1 through FIG. 5 are cross-sectional views for explaining manufacturing methods of thin film apparatuses of the first and second embodiments of the present invention and show steps during a period between forming of the thin film device on the substrate and peeling the thin film device from the heat resistant substrate.

<First Step>

Figure 1:
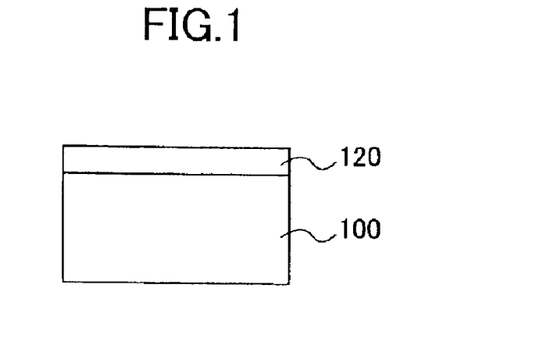
FIG. 1 is a view for explaining manufacturing methods of thin film apparatuses of first and second embodiments of the present invention.

Referring to FIG. 1, a heat resistant substrate 100 and a separation layer 120 are used for the first step.

According to the manufacturing method of the thin film apparatus of these embodiments, first, the separation layer 120 is formed on the heat resistant substrate 100. The material for the heat resistant substrate 100 is required to meet a purpose for manufacturing an organic electronic device, that is to have small change of measurement. More particularly, a silicon(Si) wafer, a glass substrate, a ceramics substrate, and the like, can be used as the heat resistant substrate 100.

In these embodiments, it is important for the separation layer 120 to have (1) a heat resistance so that the active matrix layer made of the organic TFT can be formed, (2) sure adherability to the active matrix layer, (3) durability to an etching process in a case of patterning at the time for forming the active matrix layer, (4) a strong adherability to resist the process with the heat resistant substrate (for example, a strength higher than 10 g/cm in the 90 degrees peeling test) and (5) adherability that provides peel-controllability without causing damage to other layers at the time of the fourth step, to less than 10 g/cm under in the 90 degrees peeling test, for example.

In the present invention, the adhesive force of the separation layer 120 can be controlled by generating the liquid phase at the interface, so that the liquid phase can be a force to cause peeling. It is generally preferable that the thickness of the separation layer 120 be approximately 1-20 μm.

In the present invention, an organic film, formed by a chemical vapor deposition method with an organic material and/or gas of the organic material, may be used for the separation layer 120.

In addition, an organic film made of poly-para-xylylene known by the trademark Parylene or a derivative of the poly-para-xylylene (hereinafter "parylene") or fluorinated polymer may be used for the separation layer 120. Particularly, the poly-para-xylylene film is effective in that the adhering force can be controlled by generating the liquid phase at the interface.

A basic structure of poly-para-xylylene is as follows.

In addition, a basic structure of the derivative of the poly-para-xylylene by a halogen exchange is as follows.

The parylene film is a coating film formed of poly-para-xylylene resin, developed by an American company, Union Carbide Chemicals & Plastics, with a vapor deposition.

Di-para-xylylene solid dimmer that is an ingredient of parylene is vaporized and thermally cracked and simultaneous reactions of adsorption and polymerization on the substrate of stable diradical para-xylylene monomer that is generated by the above mentioned vaporization and thermal cracking, occur, so that this coating film can be formed.

It is possible to implement minute coating with this coating film, unlike conventional liquid coating and powder coating. In addition, this coating film has excellent characteristics in that any configuration and material of an object for coating can be selected and coating can be implemented at room temperature. Hence, this coating film can be used as a proper conformal (same type) coating for wide use such as coating for ultra minute parts and all-purpose parts. For example, this coating film can be applied to an insulating film coating of a hybrid IC, a film for prevention of generation of dust powder of disk drive parts, a lubricating film of a stepping motor, a film for prevention for corrosion of a biomaterial, and the like.

<Second Step>

Figure 2:
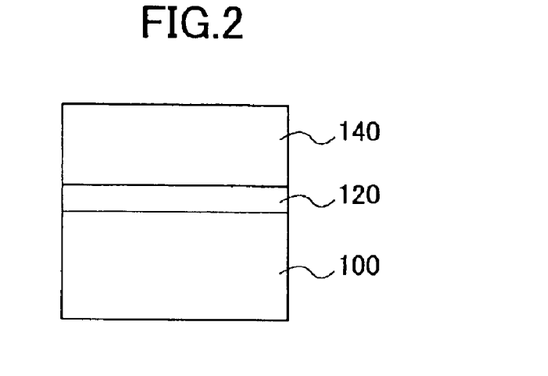
FIG. 2 is a view for explaining the manufacturing methods of the thin film apparatuses of the first and second embodiments of the present invention.
Figure 3:
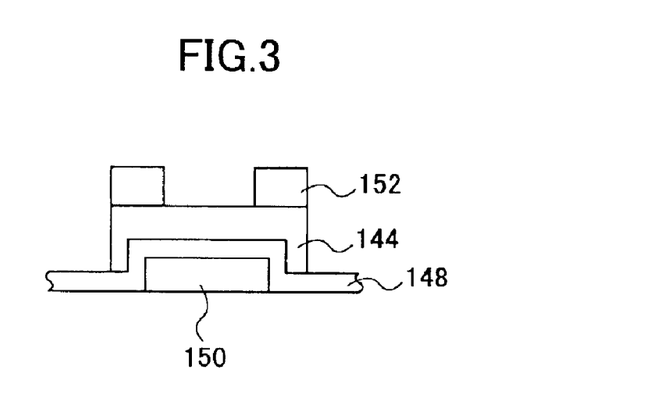
FIG. 3 is a view for explaining the manufacturing methods of the thin film apparatuses of the first and second embodiments of the present invention.

The second step is shown in FIG. 2 and FIG. 3. Referring to FIG. 2, the thin device layer 140 is used for the second step. In FIG. 2, parts that are the same as the parts shown in FIG. 1 are given the same reference numerals.

Referring to FIG. 3, an organic semiconductor layer 144, agate insulating film 148, a gate electrode 150, and source and drain electrodes 152 are used for the second step. In FIG. 3, parts that are the same as the parts shown in FIG. 1 and FIG. 2 are given the same reference numerals.

As shown in FIG. 2, the thin film device layer 140 including various thin film devices is formed on the separation layer 120. The thin film device layer 140 includes an organic TFT element as shown in FIG. 3. The organic TFT element may be formed by arranging an intermediate layer at a bottom surface of the thin film device. The TFT shown in FIG. 3 is a TFT having a reverse stagger structure. That is, the TFT shown in FIG. 3 includes the organic semiconductor layer 144, the gate insulating film 148, the gate electrode 150, and the source and drain electrode 152.

In an example shown in FIG. 2, the thin film device layer 140 includes a thin film device such as the TFT. However, the thin film device formed in this thin film device layer 140 may be not only the TFT but also, corresponding to kinds of machines to be manufactured, for example an organic thin film diode, a photoelectric conversion element (optical sensor, solar battery) made by a PIN connection of an organic electronic material, an organic resistance element, other kinds of the organic thin film semiconductor devices, various kinds of the organic electrodes, a switching element, a memory, and the like. Functions of the above mentioned organic thin film devices are improved by having a large area and integration.

The manufacturing method of the thin film device of the present invention can be applied to a manufacturing method of an active matrix substrate. In this case, in the second step, the thin film transistor as the thin film device is formed on the heat resistant substrate as forming a matrix, so that the active matrix substrate having the thin film transistor as forming a matrix shape can be obtained.

<Third Step>

Figure 4:
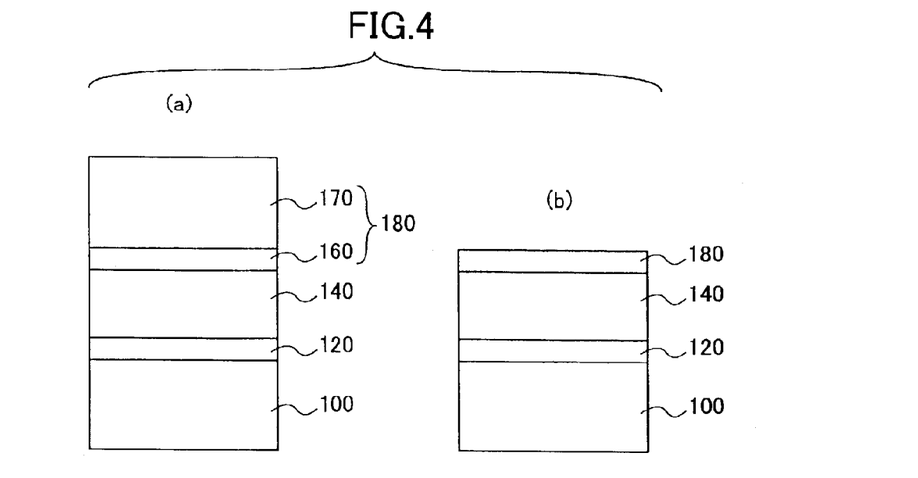
FIG. 4 is a view for explaining the manufacturing methods of the thin film apparatuses of the first and second embodiments of the present invention.

FIG. 4-(a) is a view for explaining the first embodiment of the present invention. FIG. 4-(b) is a view for explaining the second embodiment of the present invention.

As shown in FIG. 4-(a), an adhesive layer 160, a surface substrate 170, and a surface layer 180 are used for the first embodiment. As shown in FIG. 4-(b), the surface layer 180 is used for the second embodiment.

In FIG. 4, parts that are the same as the parts shown in FIG. 1, FIG. 2 and FIG. 3 are given the same reference numerals. Hereinafter, the first and second embodiments will be explained separately.

(First Embodiment)

As shown in FIG. 4-(a), the surface layer 180 is formed by adhering the surface substrate 170 on the thin film device layer 140 (at a side opposite to the heat resistant substrate 100) with the adhesive layer 160.

Various curing type adhesive layers, for example a reactive curing type adhesive agent, a heat curing type adhesive agent, an optical curing type adhesive agent such as an ultraviolet ray curing type adhesive agent, or an anaerobic curing type adhesive agent may be used as a proper example of an adhesive agent composing the adhesive layer 160. The adhesive agent may be comprised by, for example, an epoxy group, an acrylate group, a silicone group, and any other groups. Such an adhesive layer 160 may be formed by, for example, an application method.

In a case where the curing type adhesive agent is used for the adhesive layer 160, for example, after the adhesive agent is applied on the thin film device layer 140 and the surface substrate 170 is connected thereto, the adhesive agent is cured by a curing method corresponding to a characteristic of the curing type adhesive agent, so that the thin film device layer 140 and the surface substrate 170 adhere and are fixed.

In a case where the optical curing type adhesive agent is used for the adhesive layer 160, for example, after the adhesive agent is applied on the thin film device layer 140 and the surface substrate 170 is connected thereto, if the heat resistant substrate 100 has an optical permeability, light is irradiated from a side of the heat resistant substrate onto the adhesive agent, so that the adhesive layer becomes cured and the thin film device layer 140 and the surface substrate 170 adhere and are fixed.

Alternatively, in a case where a material having an optical permeability is used as a surface substrate, light may be irradiated from a side of the surface substrate 170 onto the adhesive agent. In addition, light may be irradiated from both sides of the heat resistant substrate 100 having an optical permeability and the surface substrate 170 having an optical permeability onto the adhesive layer. In this case, an ultraviolet ray curing type adhesive agent is preferable as the adhesive agent, because it is difficult for the ultraviolet ray curing type adhesive agent to have an influence on the thin film device layer 140.

A water soluble adhesive agent may be used as the adhesive layer 160. For example, polyvinyl alcohol resin, Chemiseal U-451D (product name) made by Chemitech Inc., or Three Bond 3046 (product name) made by Three Bond Co., Ltd. may be used as the adhesive layer 160.

Instead of forming the adhesive layer 160 at a side of the thin film device layer 140, the adhesive layer 160 may be formed at a side of the surface substrate 170 so as to adhere the surface substrate 170 to the thin film device layer 140 with the adhesive layer 160. Forming the adhesive layer 160 can be omitted to in a case where the surface substrate 170 itself has an adhesive function.

The characteristics, such as the heat resistance and the corrosion resistance, of the surface substrate 170 may be inferior to the heat resistant substrate 100. That is, in the present invention, since this thin film device layer 140 is transferred to the surface substrate 170 after the thin film device layer 140 is formed on a surface of the heat resistant basic layer 100, the surface substrate 170 is not required to have a characteristic such as substrate measurement stability.

Depending on kinds of machines to be manufactured, the surface substrate 170 is required to have a mechanical characteristic such as rigidity(strength) to some extent, but the surface substrate 170 may have flexibility and elasticity.

For example, a cheap glass substrate not having a high melting point, a thin plastic substrate having a sheet configuration, or a thick plastic substrate may be used as the surface substrate 170, depending on the kinds of machines to be manufactured. In addition, the surface substrate 170 does not have to be not a plane plate but may have a curved configuration.

In a case where a plastic substrate is used as the surface substrate 170, either a thermoplastic resin or a thermosetting resin may be used as a synthetic resin comprising the plastic substrate. For example, a polyolefin such as polyethylene, polypropylene, ethylene-propylene copolymer, ethylene-vinyl acetate copolymer (EVA), and the like, cyclic polyolefin, modified polyolefin, polyvinyl chloride, poly vinylidene chloride, polystyrene, polyamide, polyimide, polyamide-imide, polycarbonate, poly-4-methylpentene-1, ionomer, acrylic resin, polymethyl methacrylate, acrylic-styrene copolymer (AS resin), styrene-butadiene copolymer, ethylene-vinyl alcohol copolymer (EVOH), polyester such as polyethylene terephthalate (PET), poly butylene terephthalate(PBT), polycyclohexyl dimethylene terephthalate (PCT), and the like, polyether, polyetherketone(PEK), polyether-ether-ketone(PEEK), polyetherimide, polyacetal (POM), polyphenylene oxide, deformed polyphenylene oxide, polyallylate, aromatic polyester(liquid crystal polymer), fluorinated resin such as polytetrafluoro-ethylene, poly(vinylidene fluoride), and the like, various kinds of thermal plastic elastmer such as the styrene group, polyolefin group, polyvinyl chloride group, polyurethane group, fluororubber group, chlorinated polyethylene group, and the like, epoxy resin, phenolic resin, urea resin, melamine resin, unsaturated polyester, silicone resin, polyurethane, copolymers having the above mentioned in the main, blends having the above mentioned in the main, and polymer alloy having the above mentioned in the main, may be used. As a result of this, a stuck body wherein one kind or two more kinds of the above mentioned are stuck, may be used.

In a case where the plastic substrate is used for the surface substrate 170, there are advantages as follows. For example, a big size of the surface substrate 170 can be manufactured in a body. Furthermore, even if the surface substrate 170 has a complex configuration such as a curved surface or concave and convex configurations, the surface substrate 170 can be manufactured easily. In addition, material cost and manufacturing cost are low. Hence, in a case where the plastic substrate is used for the surface substrate 170, there is an advantage particularly for manufacturing a large and cheap device such as a liquid crystal display apparatus or an organic EL display device.

In this embodiment, the surface substrate 170 may form a independent basic body of a device such that the active matrix substrate of an active matrix type liquid crystal display apparatus or a display apparatus using a change of a reflection ratio based on an application of an electric field, for example an electrophoresis display panel using an electrophoresis effect of a particle, is used as a thin film apparatus. For example, the surface substrate 170 may form a part of the device such as a color filter, an electrode layer, a dielectric layer, an insulating layer, and a semiconductor element.

(Second Embodiment)

As shown in FIG. 4-(b), in the second embodiment, a surface layer 180 functioning as a protection layer is formed at a side opposite to the heat resistant substrate 100 of the thin film device layer 140. Since there is a case where the organic TFT does not have good resistance to weather, a material providing high barrier to water, oxygen, and the like, is selected as the surface layer 180.

<Fourth Step>

Figure 5:
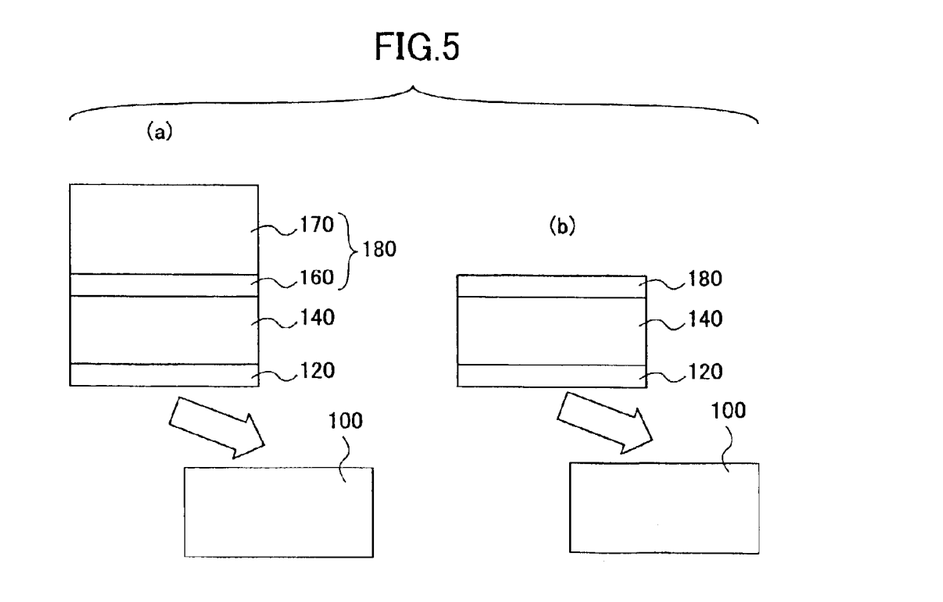
FIG. 5 is a view for explaining the manufacturing methods of the thin film apparatuses of the first and second embodiments of the present invention.

FIG. 5-(a) is a view for explaining the first embodiment of the present invention and shows a step following to the step shown in FIG. 4-(a).

FIG. 5-(b) is a view for explaining the second embodiment of the present invention and shows a step following to the step shown in FIG. 4-(b).

(First Embodiment)

As shown in FIG. 5-(a), a peeling process at the interface of the heat resistant substrate 100 and the separation layer 120 is implemented. In this step, an end part of the stuck body shown in FIG. 4-(a) is cut and the adhering force of the separation layer can be reduced by entering a liquid phase from an end part of a cut surface. Water, alcohol, or a general organic solvent can be used as the liquid phase. The liquid may be vapor.

Accordingly, as shown in FIG. 5-(a), when a force is applied so as to peel the heat resistant substrate 100, the heat resistant substrate 100 can be peeled easily from the separation layer 120. As a result of this, the thin film device layer 140 can be transferred to the surface substrate 170.

Furthermore, it is possible to reduce manufacturing cost by reusing (recycling) the heat resistant substrate 100.

Taking the above mentioned respective steps, transferring the thin film device layer 140 to the surface substrate 170 is completed, so that the thin film apparatus wherein the thin film device layer 140 is transferred onto the surface substrate 170 can be manufactured. Alternatively, the surface substrate 170, wherein the thin film device layer 140 is formed, may be provided of a desirable material, so that the thin film apparatus can be manufactured.

(Second Embodiment)

As shown in FIG. 5-(b), a peeling process at the interface of the heat resistant substrate 100 and the separation layer 120 is implemented. In this step, an end part of the stuck body shown in FIG. 4-(b) is cut and the adhering force of the separation layer 120 can be reduced by entering a liquid phase from an end part of a cut surface. Water, alcohol, or a general organic solvent can be used as the liquid phase. The liquid may be vapor.

Accordingly, as shown in FIG. 5-(b), when a force is applied so as to peel the heat resistant substrate 100, the heat resistant substrate 100 can be peeled easily from the separation layer 120. As a result of this, an independent film element having the thin film device layer 140, wherein the surface layer 180 functions as a protection layer, can be obtained.

Furthermore, it is possible to reduce manufacturing cost by reusing (recycling) the heat resistant substrate 100.

The same material and same type of manufacturing method as applied to the separation layer 120 can be applied to the surface layer 180, so as to reduce the amount of manufacturing equipment.

Particularly, the organic film using a poly-para-xylylene material is effective as the surface layer 180 and the separation layer 120. In addition, poly-para-xylylene material itself has good mechanical strength. Hence, when the separation layer 120 is peeled from the heat resistant substrate 100 in the fourth step, the separation layer 120 can be handled as an independent body. In addition, in a case where the separation layer 120 has sufficient thickness, the separation layer 120 can be used as the thin film apparatus without implementing further processes. Furthermore, if necessary, the separation layer 120 is connected to another substrate by the fifth step described below, so that a stable thin film apparatus having high reliability can be provided.

Thus, according to the manufacturing methods of the thin film apparatus of the first and second embodiments, the thin film device layer 140 itself that is an object to be peeled off, is not peeled directly. Rather, the heat resistant substrate 100 is peeled from the thin film device layer 140 by the separation layer 120. Thus, the heat resistant substrate 100 can be peeled from a side of the thin film device layer 140 easily and surely. Therefore, the thin film apparatus having a high reliability can be manufactured without the thin film device layer 140 being damaged due to a peeling operation.

Next, the third and fourth embodiments will be described with reference to FIG. 6 and FIG. 7.

Figure 6:
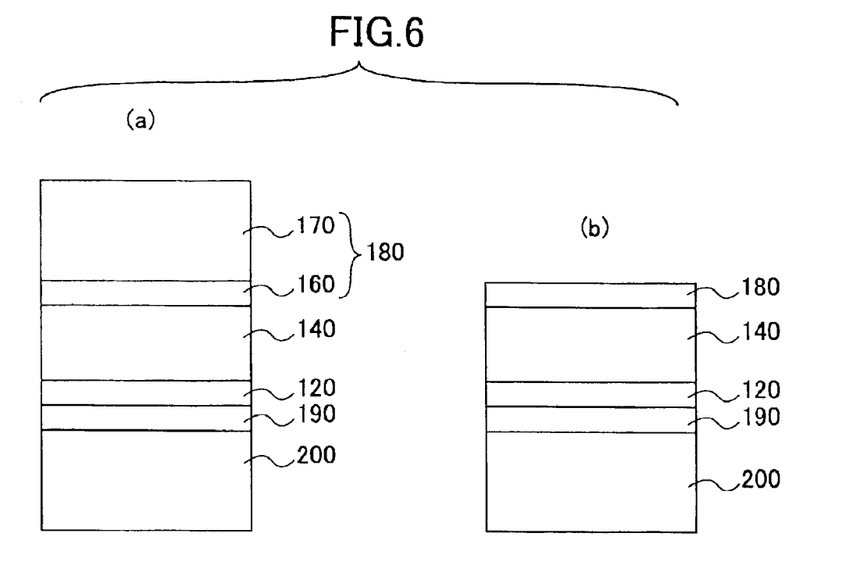
FIG. 6 is a view for explaining manufacturing methods of thin film apparatuses of third and fourth embodiments of the present invention.

FIG. 6 is a view for explaining manufacturing methods of thin film apparatuses of third and fourth embodiments. FIG. 7 is a view for explaining the manufacturing method of the thin film apparatus of the third embodiment. A step, whereby a bottom surface substrate is adhered after the heat resistant substrate is peeled from the thin film device, is shown in FIG. 6 and FIG. 7.

<Fifth Step>

The third embodiment is shown in FIG. 6-(a) and the fourth embodiment is shown in FIG. 6-(b). As shown in FIG. 6, an adhesive layer 190 and a bottom surface substrate 200 are used in the fifth step.

(Third Embodiment)

As shown in FIG. 6-(a), the bottom surface substrate 200 is adhered to a lower surface of the thin film device layer 140, that is a surface situated at the side where the heat resistant substrate is peeled, by the adhesive layer 190. Various curing type adhesive agents, for example a reactive curing type adhesive agent, a heat curing type adhesive agent, an optical curing type adhesive agent such as a ultraviolet rays curing type adhesive agent, and an anaerobic curing type adhesive agent may be used as a proper example of an adhesive agent comprising the adhesive layer 160. The adhesive agent may comprise, for example, an epoxy group, an acrylate group, a silicone group, and any other such groups. Such an adhesive layer 160 may be formed by, for example, an application method.

In a case where a curing type adhesive agent is used for the adhesive layer 190, for example, after the adhesive agent is applied to the lower surface of the thin film device layer 140 and the bottom surface substrate 200 is connected thereto, the curing type adhesive agent is cured by a curing method corresponding to a characteristic of the curing type adhesive agent so that the thin film device layer 140 and the third substrate 200 adhere and are fixed.

In a case where an optical curing type adhesive agent is used as the adhesive layer 190, it is preferable that light be irradiated from a side of the bottom surface substrate 200 having optical permeability. In a case where an ultraviolet ray curing type adhesive agent, by which it is difficult to negatively influence the thin film device layer 140, is used, the light may be irradiated from a side of the surface substrate 170 having optical permeability or from the both sides of the surface substrate 170 and the bottom surface substrate 200. The adhesive layer 190 may be formed at the bottom surface substrate 200 and the thin film device layer 140 may adhere thereon. In a case where the bottom surface substrate 200 itself has an adhering function, forming the adhesive layer 190 can be omitted.

(Fourth Embodiment)

As shown in FIG. 6-(b), the bottom surface substrate 200 is adhered onto a lower surface of the thin film device layer 140, that is a surface situated at a side where the heat resistant substrate is peeled, by the adhesive layer 190. Various curing type adhesive agents, for example a reactive curing type adhesive agent, a heat curing type adhesive agent, an optical curing type adhesive agent such as an ultraviolet ray curing type adhesive agent, and an anaerobic curing type adhesive agent may be used as a proper example of a adhesive agent comprising the adhesive layer 160. The adhesive agent may comprise, for example, an epoxy group, an acrylate group, a silicone group, and any other groups. Such an adhesive layer 160 may be formed by, for example, an application method.

In a case where the optical curing type adhesive agent is used as the adhesive layer 190, it is preferable that light be irradiated from a side of the bottom surface substrate 200 having optical permeability. In a case where the ultraviolet rays curing type adhesive agent, by which it is difficult to influence the thin film device layer 140, is used, the light may be irradiated from a side of the surface substrate 170 having optical permeability. In a case where the surface layer 180 has optical permeability, the light may be irradiated from both sides of the surface layer 180 and the bottom surface substrate 200. The adhesive layer 190 may be formed at the bottom surface substrate 200 and the thin film device layer 140 may adhere thereon. In a case where the bottom surface substrate 200 itself has an adhering function, forming the adhesive layer 190 can be omitted.

In the third and fourth embodiments, it is acceptable for the characteristics such as heat resistance and the corrosion resistance of the bottom substrate 200 to be inferior to the same characteristics of the heat resistant substrate 100.

Depending on kinds of machines to be manufactured, the bottom surface substrate 200 is required to have a mechanical characteristic such as rigidity (strength) to some extent, but the bottom surface substrate 200 may have flexibility and elasticity.

For example, a thin plastic substrate having a sheet configuration, or a thick plastic substrate may be used as the bottom surface substrate 200, depending on the kinds of machines to be manufactured. In addition, the bottom surface substrate 200 does not have to be a plane plate but may have a curved configuration.

In a case where a plastic substrate is used as the bottom surface substrate 200, either a thermoplastic resin or a thermosetting resin may be used as a synthetic resin comprising the plastic substrate. For example, polyolefins such as polyethylene, polypropylene, ethylene-propylene copolymer, ethylene-vinyl acetate copolymer (EVA), and the like, cyclic polyolefin, modified polyolefin, poly vinyl chloride, poly vinylidene chloride, polystyrene, polyamide, polyimide, polyamide-imide, polycarbonate, poly-4-methylpentene-1, ionomer, acrylic resin, polymethyl methacrylate, acrylic-styrene copolymer (AS resin), styrene-butadiene copolymer, ethylene-vinyl alcohol copolymer (EVOH), polyester such as polyethylene terephthalate (PET), poly butylene terephthalate(PBT), polycyclohexyl dimethylene terephthalate (PCT), and the like, polyether, polyetherketone(PEK), polyether-ether-ketone(PEEK), polyetherimide, polyacetal(POM), polyphenylene oxide, deformed polyphenylene oxide, polyallylate, aromatic polyester(liquid crystal polymer), fluorinated resin such as polytetrafluoro-ethylene, poly(vinylidene fluoride), and the like, various kinds of thermal plastic elastmers such as the styrene group, polyolefin group, polyvinyl chloride group, polyurethane group, fluororubber group, chlorinated polyethylene group, and the like, epoxy resin, phenolic resin, urea resin, melamine resin, unsaturated polyester, silicone resin, polyurethane, copolymers having the above mentioned in the main, blends having the above mentioned in the main, and polymer alloy having the above mentioned in the main may be used. As a result of this, a stuck body wherein one kind or two more kinds of the above mentioned are stuck, may be used.

In a case where a plastic substrate is used for the bottom surface substrate 200, a big size of the bottom surface substrate 200 can be manufactured in a body. Furthermore, in a case where the plastic substrate is used for the bottom surface substrate 200, even if the bottom surface substrate 200 has a complex configuration such as a curved surface or concave and convex configurations, the bottom surface substrate 200 can be manufactured easily. In addition, in a case where the plastic substrate is used for the bottom surface substrate 200, there is an advantage of low material cost and low manufacturing cost. Hence, in a case where the plastic substrate is used for the bottom surface substrate 200, there is an advantage for manufacturing a large and a cheap device such as a liquid crystal display apparatus or an organic EL display apparatus.

In both embodiments, the bottom surface substrate 200 may form an independent body of a device such that the active matrix substrate of an active matrix type liquid crystal display apparatus or a display apparatus using a change of a reflection ratio based on an application of an electric field, for example an electrophoresis display panel using an electrophoresis effect of a particle, is used as a thin film apparatus. For example, the bottom surface substrate 200 may form a part of the device such as a color filter, an electrode layer, a dielectric layer, an insulating layer, or a semiconductor element.

<Sixth Step>

The sixth step is taken for only the third embodiment of the present invention.

Figure 7:
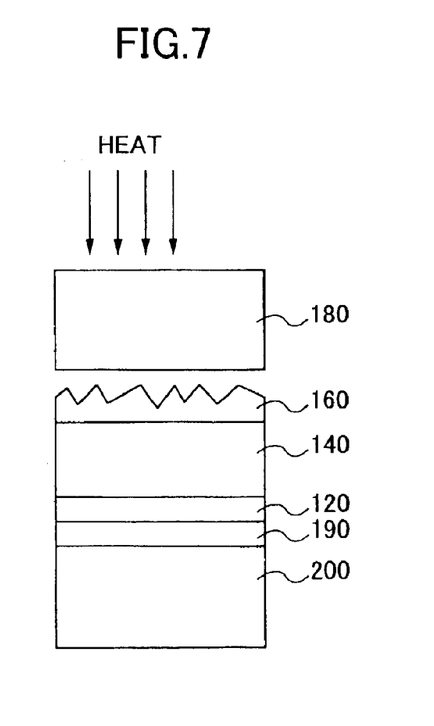
FIG. 7 is a view for explaining the manufacturing method of the thin film apparatus of the third embodiment of the present invention.

FIG. 7 is a view for explaining the manufacturing method of the thin film apparatus of the third embodiment and shows steps for peeling the surface substrate.

As shown in FIG. 7, the adhesive layer 160 made by a hot melt adhesive agent is heated so as to be hot-melted. As a result of this, since the adhesive force of the adhesive layer 160 is weakened, the surface substrate 180 can be peeled from a side of the thin film device layer 140. This surface substrate 180 can be used repeatedly by removing the hot melt adhesive agent that is adhered. Furthermore, in a case where a water-soluble adhesive agent is used as the adhesive layer 160, an area including at least the adhesive layer 160 may be immersed in pure water.

The adhesive layer 160 remaining on the surface of the thin film device layer 140 is removed so that the thin film apparatus wherein the thin film device layer 140 is transferred to the bottom substrate 200 can be manufactured.

In the present invention, after the thin film device is transferred to the surface substrate or the bottom surface material that is provided to the product finally, a wire or the like for which a process at a high temperature is not necessary may be formed on this substrate. However, it is preferable that, in the above mentioned second step, the thin film transistor be formed on the heat resistant substrate as forming a matrix, a scanning line electrically connecting to a gate of the thin film transistor, a data line electrically connecting to a source of the thin film transistor, and a pixel electrode electrically connecting to a drain of the thin film transistor, and these wires and the electrode are transferred to the substrate which is provided to the product finally as well as the thin film device.

Furthermore, in the present invention, a thin film transistor for a driving circuit may be formed as the thin film transistor so as to manufacture an active matrix substrate having a driving circuit with the thin film transistor. In addition, in the present invention, an organic TFT or an organic EL element may be formed on the heat resistant substrate.

It is possible to obtain an electro-optical apparatus such as a liquid crystal display apparatus by putting an electro-optical material such as a liquid crystal between the active matrix substrate of the present invention and a facing substrate. In addition, an electro-optical apparatus, such as an organic EL display apparatus or a display apparatus wherein a reflection ratio is changed based on an input of an electric field, can be obtained. That is, according to the present invention, since a large substrate, a cheap substrate, a light weight substrate, a deformation resistant substrate, and an unsplit substrate-can be used as a substrate provided for a product finally, it is possible to obtain an electro-optical apparatus that is cheap and light and with good impact resistance.

EXAMPLE

Next, examples related to respective embodiments will be described.

Figure 8:
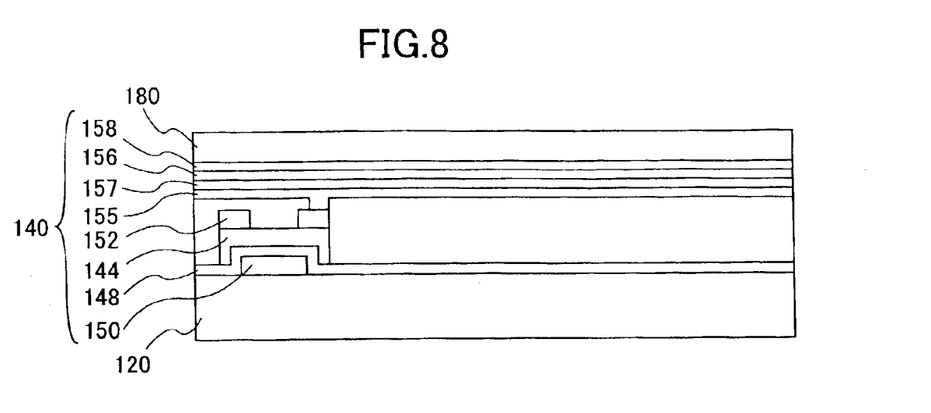
FIG. 8 is a view for explaining an example of the second embodiment of the present invention.

FIG. 8 is a view for explaining an example of the second embodiment of the present invention.

Figure 9:
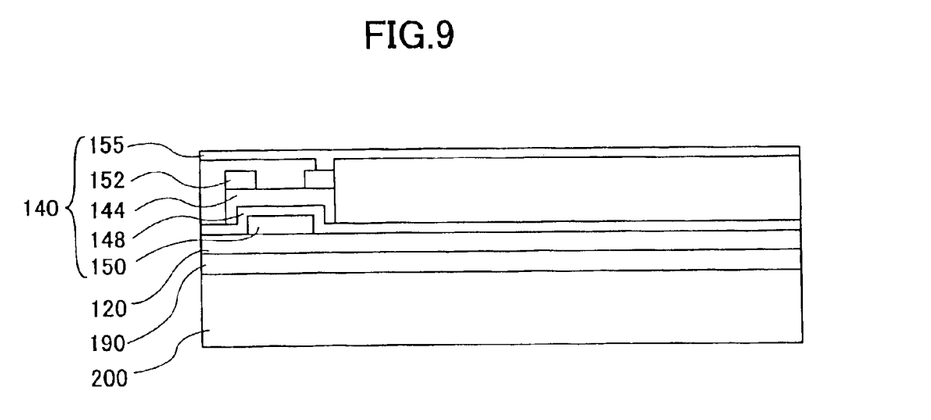
FIG. 9 is a view for explaining an example of the third embodiment of the present invention.
Figure 10:
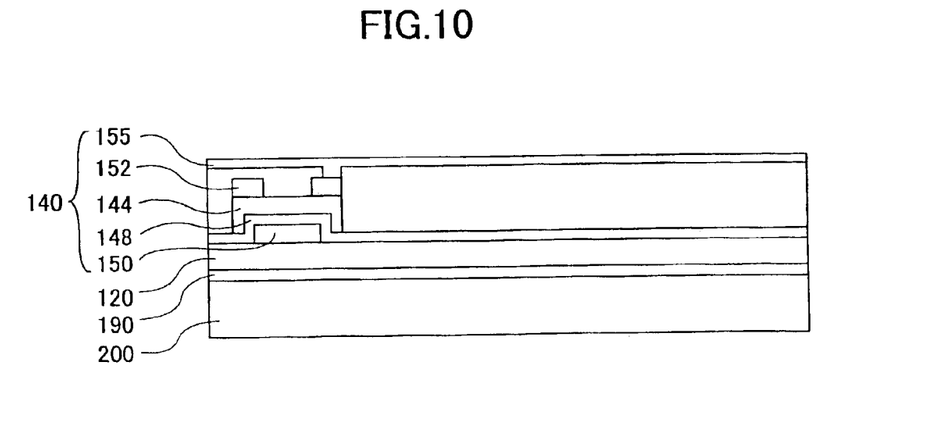
FIG. 10 is a view for explaining an example of the fourth embodiment of the present invention.

FIG. 9 is a view for explaining an example of the third embodiment of the present invention. FIG. 10 is a view for explaining an example of the fourth embodiment of the present invention.

In FIG. 8, an individual electrode is numbered as 155, an organic emission layer is numbered as 156, electrical charge injection layer is numbered as 157 and a common electrode is numbered as 158.

First Example

A specific example of the first embodiment of a manufacturing method of the thin film apparatus will be described.

According to the method, the thin film device layer 140 including the organic TFT (thin film transistor) is formed at a side of the heat resistant substrate 100 and this thin film device layer 140 is transferred to the surface substrate 170.
<First Step>

The separation film 120 made of the poly-para-xylylene film is formed on the heat resistant substrate 100 made of the Si substrate. In this example, a 4 inch Si wafer is used so as to deposit the para-xylylene film.

The poly-para-xylylene film is sublimated at 100 through 170 degrees centigrade in a reduced pressure situation by using diX__C made by Daisan Kasei Company and is continuously introduced to a heat decomposition hearth.

After a dissociative process of dimer is implemented in a state where the temperature of the heat decomposition is set as 650 degrees centigrade, poly-para-xylylene is introduced to a deposition room where the Si wafer is provided, so that the deposition is implemented at the room temperature. Thus, the poly-para-xylylene film having a film thickness of 10 $\mu$m is formed.
<Second Step>

Next, the organic TFT is formed on the separation layer 120. Cr metal film is deposited on the gate electrode by a sputtering method, until the film thickness of the Cr metal film becomes 50 nm. After that, a desirable pattern 150 is formed by photolithography etching.

Next, a gate insulating film 148 is formed. For this film, the organic insulating film is formed by a spin coating method. Polyvinyl butyral is used as the organic insulating film so as to form the film thickness of 100 nm of the gate insulating film 148.

Next, an organic semiconductor film 144 is formed. Poly hexyle thiofuran organic semiconductor material is formed by the spin coating method so as to form the film thickness of 80 nm. Making a pattern of the element and a gate electrode contact is achieved by photolithography and etching.
<Third Step>

Next, after the adhesive layer 160 made of epoxy resin as the adhesive agent is formed on the thin film device layer 140 having an organic TFT, a surface substrate 170 made of a soda glass and having a vertical length of 150 mm, a horizontal length of 150 mm, and a thickness of 0.7 mm, adheres to the thin film device layer 140 by this adhesive layer 160. Next, heat is applied to the adhesive layer 160 so as to cure the epoxy resin, and the surface substrate 170 and a side of the thin film device layer 140 adhere. The adhesive layer 160 may be an ultraviolet ray curing type adhesive agent. In this case, polymer is cured by irradiating ultraviolet rays from a side of the surface substrate 170.
(Fourth Step)

Next, one end part of the heat resistant substrate 100 is cut so as to secure a liquid phase entry path, and thereby a peeling step is implemented.

Thus, after the peering phenomenon is generated by the separation layer 120, the heat resistant substrate 100 is peeled from a side of the thin film device layer 140. As a result of this, the thin film device layer 140 is transferred to the surface substrate 170.

Thus, the thin film apparatus is manufactured. In the third step, in a case where a flexible substrate made of plastics or the like is used as the surface substrate, the organic thin film apparatus having an advantage in that the surface substrate is strong at bending and being dropped because of light weight, can be formed. CPU, RAM, an input circuit and a photovoltaic power generation cell are provided as composition elements of the organic thin film device so as to manufacture an independent type micro computer. In addition, a display element including an organic EL element can be formed.

Second Example

A specific example of the second embodiment of a manufacturing method of the thin film apparatus will be described.

According to the method, the thin film device layer 140 including the organic TFT (thin film transistor) and the organic EL element is formed at a side of the heat resistant substrate 100 and this thin film device layer 140 is transferred to the surface substrate 170.
(First Step)

The separation film 120 made of the poly-para-xylylene film is formed on the heat resistant substrate 100 made of the Si substrate. In this example, a 4 inch Si wafer is used so as to deposit the para-xylylene film.

The poly-para-xylylene film is sublimated at 100 through 170 degrees centigrade in a reduced pressure situation by using diX_C made by Daisan Kasei Company and is continuously introduced to a heat decomposition hearth.

After a dissociative process of dimer is implemented in a state where a temperature of the heat decomposition is set as 650 degrees centigrade, poly-para-xylylene is introduced to a deposition room where the Si wafer is provided, so that the deposition is implemented at the room temperature. Thus, the poly-para-xylylene film having a film thickness of 10 $\mu$m is formed.
(Second Step)

Next, the organic TFT is formed on the poly-para-xylylene film. Cr metal film is deposited on the gate electrode by a sputtering method until the film thickness of the Cr metal film becomes 50 nm. After that, a desirable pattern 150 is formed by photolithography etching.

Next, a gate insulating film 148 is formed. For this film, the organic insulating film is formed by a spin coating method. Polyvinyl butyral is used as the organic insulating film so as to form the film thickness of 100 nm of the gate insulating film 148.

Next, an organic semiconductor film 144 is formed. Poly hexyle thiofuran organic semiconductor material is formed by the spin coating method so as to form the film thickness of 80 nm. Making a pattern of the element and a gate electrode contact is achieved by photolithography and etching. An individual electrode 155 in the organic EL element electrically connected to the source and drain electrodes 152 at the end part of the organic TFT is formed by a transparent conductive film.

Next, the organic emission layer 156 is deposited. A conductive polymeric film as an electrical charge injection layer 157 contributing to obtain high efficiency of an electrical charge injection may be provided between the transparent conductive film 155 and the organic emission layer 156.

More specifically, an ITO(Indium Tin Oxide) film having the film thickness of 100 nm, as the transparent conductive film 155, is selectively formed by sputtering. And then, a polyethylene dihydroxy thiophene film having the film thickness of 50 nm, as the electrical charge injection layer 157, is deposited by spin coating. Polyphenylene vinylene material having the film thickness of 80 nm, as the organic emission layer 156, is formed by spin coating.

Next, as the common electrode 158, barium and silver are deposited by a vacuum evaporation method. Thus, the thin film device layer 140 is formed.
(Third Step)

Next, the poly-para-xylylene film having the film thickness of 50 $\mu$m is deposited on the thin film device layer 140 having an organic TFT and an organic EL element.
(Fourth Step)

Next, one end part of the heat resistant substrate 100 is cut so as to secure a liquid phase entry path, and thereby a peeling step is implemented.

Thus, after the peeling phenomenon is generated at the interface surface of the poly-para-xylylene film and the heat resistant substrate 100, the heat resistant substrate 100 is peeled from a side of the thin film device layer 140. As a result of this, the poly-para-xylylene independent body thin film device is formed as shown in FIG. B.

The organic thin film apparatus manufactured by the above mentioned steps is strong at bending and being dropped because of a light weight.

Third Example

As a specific example of the third embodiment, a manufacturing method of the active matrix substrate (thin film device) of the liquid crystal display apparatus and the electrophoresis display apparatus (electro-optical apparatus) will be described. According to the method, the organic TFT is formed at the heat resistant substrate 100 as the thin film device layer 140. This thin film device layer 140 is transferred to the surface substrate 170 and then further transferred to the bottom surface substrate 200.
(First Step)

The separation layer 120 made of the poly-para-xylylene film is formed on the heat resistant substrate 100 made of the glass substrate. In this example, the poly-para-xylylene film is formed on the glass substrate having a vertical length of 100 mm, a horizontal length of 100 mm, and a thickness of 1.1 mm.
(Second Step)

Next, the organic TFT is formed on the separation layer 120. Cr metal film is deposited on the gate electrode by a sputtering method, until the film thickness of the Cr metal film becomes 50 nm. After that, a desirable pattern 150 is formed by photolithography etching.

Next, a gate insulating film 148 is formed. For this film, the organic insulating film is formed by a spin coating method. Polyvinyl butyral is used as the organic insulating film so as to form the film thickness of 100 nm of the gate insulating film 148.

Next, an organic semiconductor film 144 is formed. Poly hexyle thiofuran organic semiconductor material is formed by the spin coating method so as to form the film thickness of 80 nm. Making a pattern of the element and a gate electrode contact is achieved by photolithography and etching.

Next, the source and drain electrodes 152 are formed. Furthermore, the individual electrodes 155 electrically connected to the source and drain electrodes 152 situated at the end part of the organic TFT are formed thereon.
(Third Step)

A cheap surface substrate 170, such as a soda glass substrate, adheres to the adhesive layer 160. This adhesive layer functions as a separation layer shown in the sixth step, too.
(Fourth Step)

Next, one end part of the heat resistant substrate 100 is cut so as to secure a liquid phase entry path, and thereby a peeling step is implemented.

Thus, after the peeling phenomenon is generated by the separation layer 120, the heat resistant substrate 100 is peeled from a side of the thin film device layer 140. As a result of this, the thin film device layer 140 is transferred to the surface substrate 170.
(Fifth Step)

A flexible sheet as the bottom surface substrate 200 is connected to a surface where the heat resistant substrate 100 is peeled.
(Sixth Step)

The surface substrate 170 is separated by using the adhesive layer 160 as a separation layer. As a result of this, the thin film device layer 140 is transferred to the bottom surface substrate 200. Thus, the active matrix substrate used for the electro-optical display apparatus of this example is manufactured by forming the thin film device layer 140 at the heat resistant substrate 100 under proper conditions, transferring the thin film device layer 140 from the heat resistant substrate 100 to the surface substrate 170, and connecting to a side of a flexible bottom surface substrate 200 made by a plastic sheet substrate.

Furthermore, since the thin film device layer 140 is transferred twice, the thin film device layer 140 maintains a stuck structure wherein the TFT is formed on the heat resistant substrate 100 in a state where transferring the thin film device layer 140 to the bottom surface substrate 200 is completed.

Because of this, the active matrix substrate is obtained as shown in FIG. 9. A pixel electrode is exposed at a back side of the thin film device layer of this active matrix substrate. Hence, it is possible to form an electro-optical display cell at the back side of the thin film device layer of this active matrix substrate.

The above mentioned electoroptical display apparatus includes the active matrix substrate, a facing substrate stuck to the active matrix substrate with a designated space, and liquid crystal or electrophoresis fluid that is injected between the active matrix substrate and the facing substrate. The facing substrate and the active matrix substrate are stuck with a designated space by a sealing material including a gap material that is formed along an outer periphery edge of the facing substrate. An inside area of this sealing material is an injection area of the liquid crystal and electrophoresis fluid. Epoxy resin and various kinds of ultraviolet curing type resins can be used for the sealing material. Since the sealing material is partially separated, if the pressure of the inside area of the sealing material is reduced after the facing substrate and the active matrix substrate are stuck, a display liquid can be injected from the separated portion of the sealing material, and the separated portion can be sealed by a sealing agent after the injection.

The facing substrate is smaller than the active matrix substrate. A driving part, such as a scanning line driving circuit or a data line driving circuit, is formed at an outer area of the active matrix substrate from the outer periphery edge of the facing substrate.

The active matrix substrate for the above mentioned electro-optical display apparatus has a center area where a pixel part implements actual display. A peripheral part of the center area functions as a driving circuit. In the pixel part where respective pixels are provided as forming a matrix shape, the organic TFT of pixel switching connected to the scanning line and the data line formed by the conductive semiconductor film is formed for respective pixels. A data side driving circuit having a shift resistor, level resistor, video line, analog switch and the like, is provided for the data line. A scanning side driving circuit having the shift resistor, the level shifter, and the like, is provided for the scanning line.

Fourth Example

A specific example of the fourth embodiment of a manufacturing method of the thin film apparatus will be described.

According to the method, the thin film device layer 140 including the organic TFT (thin film transistor) is formed at a side of the heat resistant substrate 100 and this device layer 140 is peeled from the heat resistant substrate 100. The thin film apparatus formed on the separation layer 120 further adheres to another substrate.

FIG. 10 shows a main part of the active matrix substrate of this example. Although this example includes first through fifth steps, a basic structure of the active matrix substrate is equivalent to the above mentioned second example, except that the active matrix substrate of this example does not have the organic emission layer 156, the electrical charge injection layer 157, the common electrode 158, and the bottom surface substrate 200.

Second Example (First Step)

The separation film 120 made of poly-para-xylylene film is formed on the heat resistant substrate 100 made of the Si substrate. In this example, a 4 inch Si wafer is used so as to deposit the para-xylylene film.

The poly-para-xylylene film is sublimated at 100 through 170 degrees centigrade in a reduced pressure situation by using diX_C made by Daisan Kasei Company and is continuously introduced to a heat decomposition hearth.

After a dissociative process of dimer is implemented in a state where a temperature of the heat decomposition is set as 650 degrees centigrade, poly-para-xylylene is introduced to a deposition room where the Si wafer is provided, so that the deposition is implemented at the room temperature. Thus, the poly-para-xylylene film having a film thickness of 10 $\mu$m is formed.

(Second Step)

Next, the organic TFT is formed on the poly-para-xylylene film. Cr metal film is deposited on the gate electrode by a sputtering method until the film thickness of the Cr metal film becomes 50 nm. After that, a desirable pattern 150 is formed by photolithography etching.

Next, a gate insulating film 148 is formed. For this film, the organic insulating film is formed by a spin coating method. Polyvinyl butyral is used as the organic insulating film so as to form the film thickness of 100 $\mu$m of the gate insulating film 148.

Next, an organic semiconductor film 144 is formed. Poly hexyle thiofuran organic semiconductor material is formed by the spin coating method so as to form the film thickness of 80 nm. Making a pattern of the element and a gate electrode contact is achieved by photolithography and etching. Individual electrodes 155 in the organic EL element electrically connected to the source and drain electrodes 152 at the end part of the organic TFT are formed by a transparent conductive film.

(Third Step)

Next, the poly-para-xylylene film having the film thickness of 50 $\mu$m is deposited on the thin film device layer 140 having an organic TFT and an organic EL element.

(Fourth Step)

Next, one end part of the heat resistant substrate 100 is cut so as to secure a liquid phase entry path, and thereby a peeling step is implemented.

Thus, after the peeling phenomenon is generated at the interface surface of the poly-para-xylylene film and the heat resistant substrate 100, the heat resistant substrate 100 is peeled from a side of the thin film device layer 140.

(Fifth Element)

Next, a flexible sheet is connected to a surface where the heat resistant substrate 100 is peeled as the bottom surface substrates.

The active matrix substrate manufactured by the above mentioned steps can be used for the organic thin film apparatus that is strong at bending and being dropped because of light weight. A CPU, RAM, an input circuit, and a photovoltaic power generation cell are provided as composition elements of the organic thin film device so as to manufacture an independent type micro computer. In addition, a display element including an organic EL element can be formed.

The present invention is not limited to these embodiments, but variations and modifications may be made without departing from the scope of the present invention.

This patent application is based on a Japanese priority patent application No. 2002-122329 filed on Apr. 24, 2002, the entire contents of which are hereby incorporated by reference.

What claimed is:

1. A manufacturing method of a thin film apparatus, comprising:

forming a separation layer on a heat resistant substrate;

forming a thin film device on the separation layer;

providing a surface layer at a side of the thin film device opposite to another side that faces the heat resistant substrate; and generating a peeling phenomenon at an interface of the separation layer and the heat resistant substrate so as to peel the heat resistant substrate from the other side of the thin film device, wherein an organic layer is formed as the separation layer, the organic layer having a characteristic that generates a peeling phenomenon because of a reduction of an adhering force to the heat resistant substrate of the separation layer based on a liquid phase existing at the interface of the separation layer and the heat resistant substrate, and the peeling phenomenon is generated by generating the liquid phase at the interface of the separation layer and the heat resistant substrate.

2. The manufacturing method of a thin film apparatus as claimed in claim 1, wherein the separation layer comprises poly-para-xylylene or a derivative of poly-para-xylylene.

3. The manufacturing method of a thin film apparatus as claimed in claim 1, wherein the separation layer has a film thickness greater than 10 μm.

4. The manufacturing method of a thin film apparatus as claimed in claim 1, wherein an organic layer functioning as a surface protection layer is formed as the surface layer.

5. The manufacturing method of a thin film apparatus as claimed in claim 4, wherein the organic layer is made of the same material as the separation layer.

6. The manufacturing method of a thin film apparatus as claimed in claim 4, further comprising adhering a bottom surface substrate on a surface where the heat resistant substrate is peeled from the thin film device.

7. The manufacturing method of a thin film apparatus as claimed in claim 1, wherein the surface layer is provided by adhering a surface substrate different from the heat resistant substrate with an adhesive layer, and the thin film device is transferred to the surface substrate at the same time when the heat resistant substrate is peeled from the other side of the thin film device.

8. The manufacturing method of a thin film apparatus as claimed in claim 7, wherein the adhesive layer also serves as the separation layer, and further comprising adhering a bottom surface substrate on a surface where the heat resistant substrate is peeled from the thin film device, and transferring the thin film device to a side of the bottom surface substrate, by generating a peeling phenomenon at least either in the adhesive layer also serving as the separation layer or at the interface of the adhesive layer, so as to peel the surface substrate from the other side of the thin film device.

9. The manufacturing method of a thin film apparatus as claimed in claim 1, wherein at least an organic thin film transistor is formed on the heat resistant substrate as the thin film device in the second step.

10. A thin film apparatus manufactured by a manufacturing method, the manufacturing method comprising:

forming a separation layer on a heat resistant substrate;

forming a thin film device on the separation layer;

providing a surface layer at a side of the thin film device opposite to another side that faces the heat resistant substrate; and generating a peeling phenomenon at an interface of the separation layer and the heat resistant substrate so as to peel the heat resistant substrate from the other side of the thin film device, wherein an organic layer is formed as the separation layer, the organic layer having a characteristic that generates a peeling phenomenon because of a reduction of an adhering force to the heat resistant substrate of the separation layer based on a liquid phase existing at the interface of the separation layer and the heat resistant substrate, and the peeling phenomenon is generated by generating the liquid phase at the interface of the separation layer and the heat resistant substrate.

11. A manufacturing method of an active matrix substrate having a thin film transistor as forming a matrix, comprising:

forming a separation layer on a heat resistant substrate;

forming a thin film transistor for pixel switching on the separation layer as forming a matrix;

providing a surface layer at a side of the thin film transistor opposite to another side that faces the heat resistant substrate; and generating a peeling phenomenon at an interface of the separation layer and the heat resistant substrate so as to peel the heat resistant substrate from the other side of the thin film transistor, wherein an organic layer is formed as the separation layer in the first step, the organic layer having a characteristic that generates a peeling phenomenon because of a reduction of an adhering force to the heat resistant substrate of the separation layer based on a liquid phase existing at the interface of the separation layer and the heat resistant substrate, and the peeling phenomenon is generated by generating the liquid phase at the interface of the separation layer and the heat resistant substrate.

12. The manufacturing method of an active matrix substrate having a thin film transistor as forming a matrix as claimed in claim 11, wherein the thin film transistor is formed on the heat resistant substrate as forming a matrix, and a scanning line electrically connecting to a gate of the thin film transistor, a data line electrically connecting to a source of the thin film transistor, and a pixel electrode electrically connecting to a drain of the thin film transistor are formed.

13. A manufacturing method of an active matrix substrate having a driving circuit providing a thin film transistor, comprising:

forming a separation layer on a heat resistant substrate;

forming the thin film transistor for the driving circuit on the separation layer;

providing a surface layer at a side of the thin film transistor opposite to another side that faces the heat resistant substrate; and generating a peeling phenomenon at an interface of the separation layer and the heat resistant substrate so as to peel the heat resistant substrate from the other side of the thin film transistor, wherein an organic layer is formed as the separation layer, the organic layer having a characteristic generating a peeling phenomenon because of a reduction of an adhering force to the heat resistant substrate of the separation layer based on a liquid phase existing at the interface of the separation layer and the heat resistant substrate, and the peeling phenomenon is generated by generating the liquid phase at the interface of the separation layer and the heat resistant substrate.

14. The manufacturing method as claimed in claim 1, wherein said peeling phenomenon is generated by introducing water or an organic solvent at the interface of the separation layer and the heat resistant substrate.

15. The method as claimed in claim 14, comprising introducing water at the interface of the separation layer and the heat resistant substrate.

16. The method as claimed in claim 14, comprising introducing alcohol at the interface of the separation layer and the heat resistant substrate.

17. The method as claimed in claim 14, comprising introducing an organic solvent at the interface of the separation layer and the heat resistant substrate.

18. The thin film apparatus as claimed in claim 10, wherein said peeling phenomenon is generated by introducing water or an organic solvent at the interface of the separation layer and the heat resistant substrate.

19. The thin film apparatus as claimed in claim 18, comprising introducing water at the interface of the separation layer and the heat resistant substrate.

20. The thin film apparatus as claimed in claim 18, comprising introducing alcohol at the interface of the separation layer and the heat resistant substrate.

21. The thin film apparatus as claimed in claim 18, comprising introducing an organic solvent at the interface of the separation layer and the heat resistant substrate.

22. The manufacturing method as claimed in claim 11, wherein said peeling phenomenon is generated by introducing water or an organic solvent at the interface of the separation layer and the heat resistant substrate.

23. The method as claimed in claim 22, comprising introducing water at the interface of the separation layer and the heat resistant substrate.

24. The method as claimed in claim 22, comprising introducing alcohol at the interface of the separation layer and the heat resistant substrate.

25. The method as claimed in claim 22, comprising introducing an organic solvent at the interface of the separation layer and the heat resistant substrate.

26. The manufacturing method as claimed in claim 13, wherein said peeling phenomenon is generated by introducing water or an organic solvent at the interface of the separation layer and the heat resistant substrate.

27. The method as claimed in claim 26, comprising introducing water at the interface of the separation layer and the heat resistant substrate.

28. The method as claimed in claim 26, comprising introducing alcohol at the interface of the separation layer and the heat resistant substrate.

29. The method as claimed in claim 26, comprising introducing an organic solvent at the interface of the separation layer and the heat resistant substrate.

* * * * *